United States Patent
Yu et al.

(10) Patent No.: US 9,144,165 B2
(45) Date of Patent: Sep. 22, 2015

(54) HOUSING STRUCTURE AND ELECTRONIC DEVICE USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Long Yu, Shenzhen (CN); Fang-Quan Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 250 days.

(21) Appl. No.: 13/848,213

(22) Filed: Mar. 21, 2013

(65) Prior Publication Data

US 2013/0329345 A1    Dec. 12, 2013

(30) Foreign Application Priority Data

Jun. 11, 2012   (CN) .......................... 2012 1 0189842

(51) Int. Cl.
  *H05K 7/00*   (2006.01)
  *H05K 5/04*   (2006.01)
  *H05K 5/00*   (2006.01)
  *H04M 1/02*   (2006.01)
  *H04M 1/03*   (2006.01)

(52) U.S. Cl.
  CPC ................. *H05K 5/04* (2013.01); *H04M 1/026* (2013.01); *H04M 1/03* (2013.01); *H05K 5/0017* (2013.01)

(58) Field of Classification Search
  CPC . G06F 1/1626; H04M 1/0249; H05K 5/0217; H05K 5/04
  USPC ........... 206/37, 39.5; 361/288, 679.3, 679.55, 361/679.56, 715, 755; 455/575.1, 575.8
  See application file for complete search history.

(56) References Cited

U.S. PATENT DOCUMENTS

| | | | | |
|---|---|---|---|---|
| 5,415,038 A | * | 5/1995 | Rynhart et al. | 73/431 |
| D515,098 S | * | 2/2006 | Lee | D14/203.7 |
| D570,876 S | * | 6/2008 | Lee | D14/496 |
| 7,983,037 B2 | * | 7/2011 | Zhang et al. | 361/679.55 |
| 2003/0048598 A1 | * | 3/2003 | Lee et al. | 361/681 |

(Continued)

FOREIGN PATENT DOCUMENTS

| | | |
|---|---|---|
| TW | 201206320 A1 | 2/2012 |
| TW | M426082 U1 | 4/2012 |

*Primary Examiner* — Hung S Bui
*Assistant Examiner* — James Wu
(74) *Attorney, Agent, or Firm* — Novak Druce Connolly Bove + Quigg LLP

(57) ABSTRACT

A housing structure includes a shell integrally formed in aluminum and at least one mounting member. The shell includes a bottom wall, a first end wall, a second end wall and a top wall connected to the first end wall and the second end wall. The first end wall and the second end wall extend from opposite ends of the bottom wall. The bottom wall, the first end wall, the second end wall, and the top wall cooperatively form a receiving space with at least one opening. A first installation rail and a second installation rail protrude respectively from inners wall of the first end wall and the second end wall. The at least one mounting member is connected with the first installation rail and the second installation rail to enclose the at least one opening. The disclosure also supplies an electronic device using the same.

8 Claims, 2 Drawing Sheets

(56) References Cited

U.S. PATENT DOCUMENTS

2006/0268528 A1* 11/2006 Zadesky et al. .............. 361/728
2007/0014083 A1* 1/2007 Tanaka et al. ................. 361/683
2011/0273823 A1* 11/2011 Lamers et al. ........... 361/679.01

* cited by examiner

HOUSING STRUCTURE AND ELECTRONIC DEVICE USING THE SAME

BACKGROUND

1. Technical Field

The present disclosure generally relates to housing structures, and particularly to a housing structure of an electronic device.

2. Description of the Related Art

Housings or housing structures of electronic devices are usually made of plastic, and manufactured by injection molding. Different kinds of plastic members or components need to be used to enclose functional members or components in the housing of the electronic devices during assembly, so the efficiency is relatively low. In addition, plastic housing is poorer in preventing electromagnetic interference and providing electronic protection as compared to a metal housing. However, manufacturing cost of metal housings is higher because the metal housing is usually manufactured by stamping and milling by CNC (computer numerical control) machine tools several times.

Therefore, there is room for improvement within the art.

BRIEF DESCRIPTION OF THE DRAWING

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
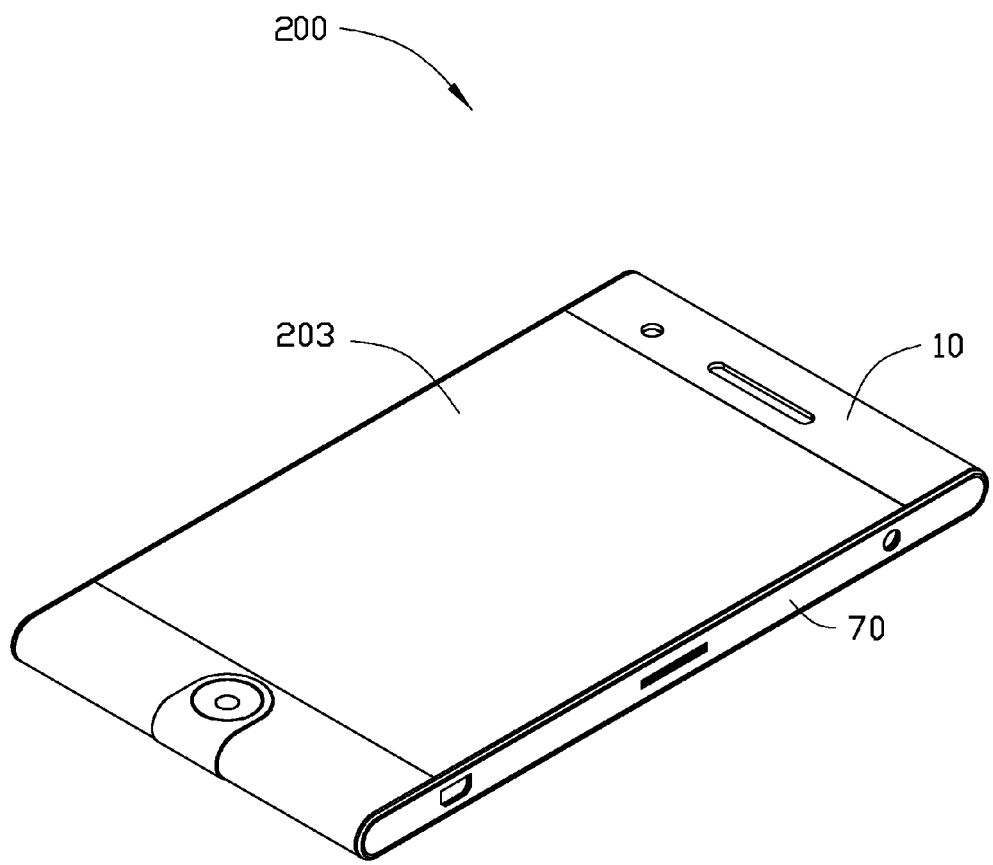
FIG. 1 shows an isometric view of an electronic device for an embodiment of the present disclosure.
Figure 2:
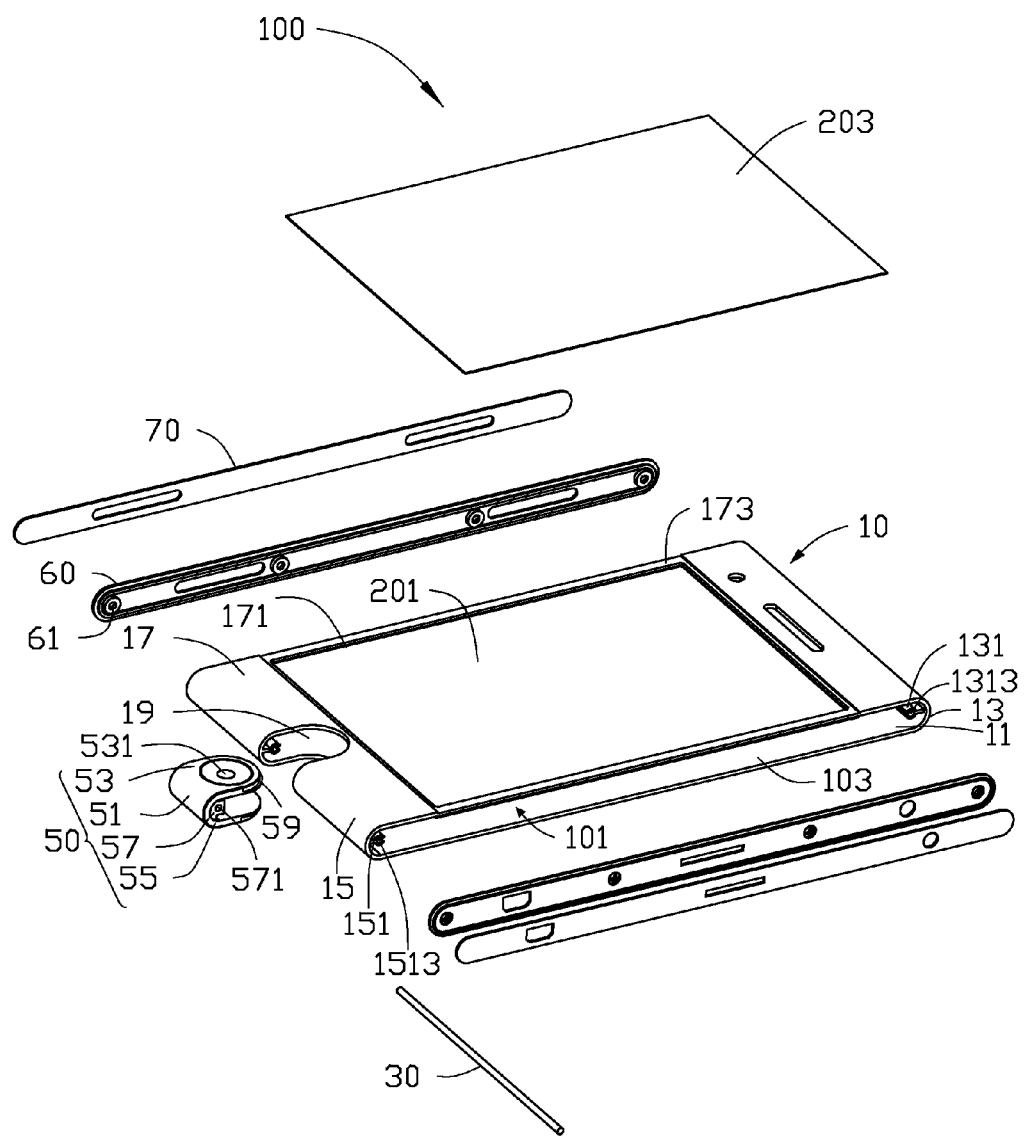
FIG. 2 is an exploded, isometric view of the electronic device of FIG. 1.

Referring to FIGS. 1 and 2, the electronic device 200 includes a housing structure 100, a display panel 201, a protective panel 203, and a plurality of functional members (not shown). The display panel 201 and the plurality of functional members of the electronic device 200 are received in the housing structure 100. The protective panel 203 is mounted on the housing structure 100 above of the display panel 201. For simplicity sake, the functional members, such as a battery, a camera, a circuit board, a main board, and so on are not described herein.

The housing structure 100 includes a shell 10, a connecting member 30, a button 50, two mounting members 60, and two cover members 70. The button 50 is mounted on one end of the shell 10 via the connecting member 30. Two mounting members 60 are positioned on opposite sides of the shell 10, and are substantially parallel to each other. Each cover member 70 is mounted on a side surface of one corresponding mounting member 60 away from the shell 10.

The shell 10 is integrally formed by having aluminum as the material thereof. The shell 10 includes a bottom wall 11, a first end wall 13, a second end wall 15, and a top wall 17. The first end wall 13 and the second end wall 15 extend from opposite ends of the bottom wall 11, respectively, by bending around in a curved shape or profile. In the illustrated embodiment, the first end wall 13 and the second end wall 15 are arc-shaped. The top wall 17 is connected to the first end wall 13 and the second end wall 15, respectively, and is substantially parallel to the bottom wall 11. The bottom wall 11, the first end wall 13, the second end wall 15 and the top wall 17 cooperatively form a receiving space 101. Two strip-shaped openings 103 are formed on two sides of the receiving space 101 for conveniently assembly of the electronic device 200. In other embodiments, only one strip-shaped opening 103 can be formed. In the illustrated embodiment, the shell 10 is manufactured by aluminum extrusion method.

A first installation rail 131 protrudes from a substantially middle portion of an inner wall of the first end wall 13 facing a center region of the receiving space 101. A mounting hole 1313 is defined in each end surface of the first installation rail 131 facing towards the two openings 103. The second end wall 15 and the first end wall 13 are substantially parallel to each other. A second installation rail 151 protrudes from a middle of an inner wall of the second end wall 15 facing towards the receiving space 101. A fixing hole 1513 is defined in each end surface of the second installation rail 151 facing towards the two openings 103. In the embodiment, a distal end of the second installation rail 151 has a C-shaped structure, and two of the fixing holes 1513 communicate with each other. A substantially rectangular-shaped display window 171 is defined in the top wall 17. A step border 173 is recessed around edges of the display window 171.

An installing hole 19 is defined in the second end wall 15, and extending from a substantially middle area of one edge of the bottom wall 11 adjacent to the second end wall 15 to the top wall 17. The second installation rail 151 is divided into two segments thereof by the installing hole 19. One end of the installing hole 19 away from the second end wall 15 is positioned adjacent to the display window 171.

The connecting member 30 is substantially a rod. The connecting member 30 passes through the second installation rail 151 via the fixing holes 1513 to mount the button 50 in the installing hole 19. A length of the connecting member 30 is shorter than a length of the second end wall 15.

The button 50 is substantially a C-shaped structure. A shape and a size of the button 50 fits and matches with that of the installing hole 19. The button 50 includes a base body 51, a first mounting portion 53, a second mounting portion 55, and two connecting slices 57. The first mounting portion 53 and the second mounting portion 55 extend from two opposite ends of the base body 51 by bending around, respectively. Edges of the base body 51, the first mounting portion 53 and the second mounting portion 55 connect with the sidewalls of the installing hole 19 for enclosing and covering the installing hole 19. The first mounting portion 53 is positioned adjacent to the top wall 17. A circular operation groove 531 is recessed in a middle of the first mounting portion 53 for convenient operation of the button 50. Edges of the first mounting portion 53 and the second mounting portion 55 away from the base body 51 are arc-shaped. A resisting flange 59 is formed on each of the edges of the first mounting portion 53 and the second mounting portion 55 away from the base body 51, respectively. The resisting flange 59 of the first mounting portion 53 resists against an inner wall of the top wall 17, and the resisting flange 59 of the second mounting portion 55 resists against an inner wall of and the bottom wall 17. The two resisting flanges 59 are received in the receiving space 101 for preventing dust or other impurities from entering the receiving space 101. Two connecting slices 57 are positioned in parallel on opposite sides of the base body 51 between the first mounting portion 53 and the second mounting portion 55. One connecting hole 571 is defined in each connecting slice 57 corresponding to the fixing hole 1513. The connecting member 30 passes through the second installation rail 151 and the connecting holes 571 to install the button 50 in the installing hole 19. In the illustrated embodiment, the button 50 is made of plastic. In other embodiments, the button 50 can be made by other materials, such as aluminum.

Each of the mounting members 60 is positioned in one opening 103, and is connected with the first installation rail 131 for enclosing the functional members of the electronic device 200 in the receiving space 101. A shape and a size of the mounting member 60 are fitting and matched with a shape and a size of the opening 103. A fastening hole 61 is defined in each end of the mounting member 60. The mounting members 60 can be fixed on the shell 10 by fasteners (not shown) passing through the fastening holes 61, the mounting holes 1313 and the fixing holes 1513. In the illustrated embodiment, the mounting members 60 are made by liquid metal to strength the housing structure.

A shape and a size of the cover member 70 is fitting and matched with a shape and a size of the mounting member 60. The cover member 70 is positioned on a side surface of the mounting member 60 away from the receiving space 101.

The display panel 201 and the functional members are received in the receiving space 101, and the display panel 201 is positioned under the display window 171. The protective panel 203 is mounted on a surface of the step border 173 away from the receiving space 101 above the display panel 201 to protect the display panel 201. Users can operate the electronic device 200 via the protective panel 203. In the illustrated embodiment, the protective panel 203 is adhered to the step border 173 via glue.

In assembly, the display panel 201 and the functional members are stacked and fixed together. Then the display panel 201 and the functional members are inserted into the shell 10 via one opening 103. The button 50 is positioned in the installing hole 19, the first mounting portion 53 corresponds to the top wall 17, and the second mounting portion 55 corresponds to the bottom wall 15. The connecting member 30 passes through one fixing hole 1513, two connecting holes 571 and another fixing hole 1513 to assemble the button 50 with the shell 10. The mounting members 60 are mounted in the openings 103. The two cover members 70 are respectively fixed on the two mounting members 60. The protective panel 203 is mounted on the step border 173.

The shell 10 of the electronic device 200 is integrally formed by aluminum extrusion method. Thus, manufacture time and cost will be reduced. Properties of preventing electromagnetic interference and providing for electronic protection of the shell 10 are thereby improved because the shell 10 is made of metal. In addition, the display panel 201 and the functional members are inserted into the receiving space 101 via the opening 103 and the two mounting members 60 are positioned to enclose the openings 103 for conveniently assembly. Further, the first installation rail 131 and the second installation rail 151 are positioned in the inner wall of the shell 10 for conveniently assembly of the mounting members 60. The mounting members 60 are made by liquid metal to strength the housing structure 100.

In other embodiments, the cover members 70 can be omitted.

In other embodiments, the connecting member 30 can be omitted, and one elastic protrusions is formed on each connecting slice 57 to connect with the second installation rail 151.

In other embodiments, the protective panel 203 can be omitted.

While the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure, as defined by the appended claims.

What is claimed is:

1. A housing structure for an electronic device comprising:
    a shell integrally formed, the shell made of aluminum, comprising:
        a bottom wall;
        a first end wall extending from one end of the bottom wall by bending around in a curved shape;
        a second end wall extending from another end of the bottom wall by bending around in a curved shape opposite to the first end wall;
        a top wall connected to the first end wall and the second end wall, respectively, and the top wall positioned substantially parallel to the bottom wall; and
    at least one mounting member, wherein the bottom wall, the first end wall, the second end wall, and the top wall cooperatively form a receiving space, two opposite sides of the receiving space form at least one opening, a first installation rail protrudes from an inner wall of the first end wall, a second installation rail protrudes from an inner wall of the second end wall, and the at least one mounting member is connected with the first installation rail and the second installation rail to enclose the at least one opening; wherein the housing structure further comprises a button and a connecting member, an installing hole is defined in the second end wall extending from the bottom wall to the top wall of the shell, the button comprises a base body, a first mounting portion positioned adjacent to the top wall of the shell, a second mounting portion positioned adjacent to the bottom wall of the shell, and two connecting slices, the first mounting portion and the second mounting portion extending from two ends of the base body by bending, respectively, the two connecting slices are parallelly positioned on opposite sides of the base body between the first mounting portion and the second mounting portion, and the connecting member passes through the second installation rail and the two connecting slices.

2. The housing structure of claim 1, wherein one resisting flange is formed on each of the edges of the first mounting portion and the second mounting portion away from the base body, the resisting flange of the first mounting portion resists against an inner wall of the top wall, the resisting flange of the second mounting portion resists against an inner wall of the bottom wall, and the resisting flanges are received in the receiving space.

3. The housing structure of claim 1, wherein the housing structure further comprises at least one cover member positioned on a side surface of the at least one mounting member away from the receiving space.

4. An electronic device comprising:
    a housing structure, comprising:
        a shell integrally formed in aluminum, comprising:
            a bottom wall;
            a first end wall extending from one end of the bottom wall by bending around in a curved shape;
            a second end wall extending from another end of the bottom wall by bending around in a curved shape opposite to the first end wall;
            a top wall connected to the first end wall and the second end wall, respectively, and the top wall positioned substantially parallel to the bottom wall; and
        at least one mounting member, and
    a plurality of functional members received in the shell, wherein the bottom wall, the first end wall, the second end wall, and the top wall cooperatively form a receiving space, the plurality of functional members are received in the shell, two opposite sides of the receiving space form at least one opening, a first installation rail protrudes from an inner wall of the first end wall, a second installation rail protrudes from an inner wall of the second end wall, and the at least one mounting member is connected with the first installation rail and the second installation rail to enclose the at least one opening; wherein the housing structure further comprises a button and a connecting member, an installing hole is defined in the second end wall extending from the bottom wall to the top wall of the shell, the button comprises a base body, a first mounting portion positioned adjacent to the top wall of the shell, a second mounting portion positioned adjacent to the bottom wall of the shell, and two connecting slices, the first mounting portion and the second mounting portion extending from two ends of the base body by bending, respectively, the two connecting slices are parallelly positioned on opposite sides of the base body between the first mounting portion and the second mounting portion, and the connecting member passes through the second installation rail and the two connecting slices.

5. The electronic device of claim 4, wherein one resisting flange is formed on each of the edges of the first mounting portion and the second mounting portion away from the base body, the resisting flange of the first mounting portion resists against an inner wall of the top wall, the resisting flange of the second mounting portion resists against an inner wall of the bottom wall, and the resisting flanges are received in the receiving space.

6. The electronic device of claim 4, wherein the housing structure further comprises at least one cover member positioned on a side surface of the at least one mounting member away from the receiving space.

7. The electronic device of claim 4, wherein the electronic device further comprises a display panel defined in the top wall, and the display panel is received in the receiving space under a display window.

8. The electronic device of claim 7, wherein the electronic device further comprises a protective panel, a step border is recessed around edges of the display window, and the protective panel is fixed on the step border.

* * * * *